United States Patent

Dent

[19]

[11] Patent Number: 6,012,160
[45] Date of Patent: Jan. 4, 2000

[54] METHOD FOR PROTECTING IMPORTANT DATA BITS USING LESS IMPORTANT DATA BITS

[75] Inventor: Paul W. Dent, Pittsboro, N.C.

[73] Assignee: Ericsson Inc., Research Triangle Park, N.C.

[21] Appl. No.: 08/943,885

[22] Filed: Oct. 3, 1997

[51] Int. Cl.[7] .................................................. G06F 11/08
[52] U.S. Cl. .......................... 714/786; 714/739; 714/796; 714/790
[58] Field of Search ................................. 714/786, 790, 714/755, 739, 796

[56] References Cited

U.S. PATENT DOCUMENTS

| | | | |
|---|---|---|---|
| 5,247,579 | 9/1993 | Hardwick et al. | 381/40 |
| 5,438,621 | 8/1995 | Hornak et al. | 380/43 |
| 5,493,584 | 2/1996 | Emeott | 375/224 |
| 5,517,751 | 5/1996 | Hardwick et al. | 714/755 |
| 5,548,615 | 8/1996 | Wei | 375/281 |
| 5,666,370 | 9/1997 | Ganesan et al. | 371/37.01 |
| 5,808,572 | 9/1998 | Yang et al. | 341/107 |
| 5,825,824 | 10/1998 | Lee et al. | 375/292 |
| 5,903,550 | 5/1999 | Spock | 370/335 |

FOREIGN PATENT DOCUMENTS

98/20538  3/1999  WIPO .

*Primary Examiner*—Emmanuel L. Moise
*Assistant Examiner*—Esaw Abraham
*Attorney, Agent, or Firm*—Jenkens & Gilchrist, P.C.

[57] ABSTRACT

A method and apparatus for protecting a first group of data bits using a second group of data bits within digital data transmissions is disclosed. First and second groups of data bits are encoded for transmission in a communication network. The second group of encoded data bits are scrambled using a scrambling mask generated from the first group of data bits. The first group of encoded data bits and the second group of encoded and scrambled data bits are then interleaved and transmitted to a receiver. The first group of data bits are decoded and used to regenerate the scrambling mask to descramble the second group of encoded and scrambled data bits. The second group of data bits may then be decoded. The results of the decoding of the second group of data bits are used to determine whether or not the first group of data bits were properly decoded.

32 Claims, 12 Drawing Sheets

METHOD FOR PROTECTING IMPORTANT DATA BITS USING LESS IMPORTANT DATA BITS

BACKGROUND OF THE INVENTION

1. Technical Field of the Invention

The present invention relates to the transmission of digital data bits, and more particularly, to a method for utilizing a second set of digital data bits to detect errors within a first set of digital data bits.

2. Description of Related Art

The transmission of digital data bits or symbols over noisy channels gives rise to the possibility of errors within the transmitted digital data symbols. Errors in some symbols are more catastrophic than errors in other symbols and must be protected with error detection and correction- In the transmission of mobile wireless signals, the data symbols may represent different parts of a digitized speech waveform. If errors occur in the more important data bits (Class I bits) of a speech waveform and are undetected, processing of the speech waveform by a speech decoder may cause unpleasant artefacts to occur. Artefacts comprise unpleasant, non-speech sounds created within a decoded speech waveform due to decoding errors. Errors within the less important speech bits (Class II bits) of the speech waveform only cause tolerable increases in the background noise.

Errors in the more important Class I data bits must be detected in order to enable the use of various means for masking the generation of artefacts. For example, British Patent No. 8119215, incorporated herein by reference, describes how a corrupt segment of the speech waveform can be replaced by an earlier received segment of the speech waveform corresponding to a segment of the speech waveform approximately one or more larynx pulse periods previous to the corrupted segment. More sophisticated error masking strategies known as artificial regeneration are described in U.S. Pat. No. 5,097,507, which is incorporated herein by reference.

When the input bits representing digitized speech produced by speech digitizers, such as a residually excited linear predictive (RELP) coder, a vector code block excited linear predictive (VSELP) coder or an advanced multi-band excitation (or sub-band) encoder (AMBE), are processed, certain bits (the Class I bits) are not only more important than other bits (the Class II bits) to protect with error correction coding, but they are also more important to protect with error detection processes. When error correction coding fails, artefacts are produced which can be very disturbing to a listener. Artefacts may be prevented by detecting when errors have occurred in the Class I bits and muting the audio output or incorporating sophisticated error bridging techniques.

Various methods presently exist for error detection within decoded digital data. One of these methods, frame-based speech decoding methods, divides the bits in a frame into important and less important bits and protects the most important bits using cyclic redundancy check (CRC) codes for error detection. This process is described in the published standards for the European digital cellular system known as GSM.

In land-based cellular radio telephone systems which are capacity limited by mutual interference between co-channel users, the addition of the CRC code to all transmissions does not alter the carrier to interference ratio (C/I) of a signal and does not therefore have a significant effect upon capacity. In a satellite communication system that is capacity limited by the amount of satellite transmission power available to combat thermal background noise, the addition of a CRC code to the transmission increases the number of bits or symbols that must be transmitted. This increases the transmitter power needed. The error detection capability of the CRC code is thus only obtained at the expense of transmitted power. Since increasing transmitted power would have reduced the error rate even without using a CRC code, no clear benefit is obtained. Thus, a method of improving detection of errors in a group of more important bits, such as Class I speech bits, without increasing the number of symbols necessary to be transmitted would be of great benefit. U.S. Pat. No. 5,517,511 (Hardwick, et al.) describes a method using Golay block codes to detect errors Iin a first group of bits by decoding a second group of bits. Golay codes however are only available for a specific coding rate of ½ which is inadequate in many situations. Therefore, a method is required using more flexible convolutional codes.

SUMMARY OF THE INVENTION

The present invention overcomes the foregoing and other problems with an improved system for transmitting a coded signal including a first and second group of data symbols. The digital data to be transmitted is divided into two groups of symbols for transmission which are identified as most important bits (symbols) and less important bits (symbols). The most important bits are error correction coded using a convolutional code providing a high level of redundancy, such as a rate ¼ tailbiting convolutional code, while the less important data symbols are error correction coded using a convolutional code having a lower level of redundancy, such as a rate ½ tailbiting convolutional code. Tailbiting codes are used to avoid the overhead of transmitting tail bits which are as wasteful as transmitting CRC check codes. The uncoded, most important bits are used to scramble the coded, less important bits for transmission, such as by adding a apseudo-random bit pattern dependent on the uncoded most important bits, or by altering the bit transmission order in dependence thereon.

A receiver separates the scrambled and coded less important bits from the coded most important bits and decodes the most important bits using an error correction decoder adapted to decode the highly redundant convolutional code, producing a first cumulative decoding metric. The decoded most important bits are used to unscramble the coded less important bits. The unscrambled, less important bits are then decoded using an error correction decoder adapted to the error correction code of lower redundances and a second cumulative metric is produced. An error checker processes the first and second cumulative metrics to determine if the metrics lie in a region in which the decoding will be accepted or in a region in which decoded data will be rejected.

BRIEF DESCRIPTION OF THE DRAWINGS

For a more complete understanding of the present invention, reference is made to the following detailed description taken in conjunction with the accompanying drawings wherein.

DETAILED DESCRIPTION OF THE INVENTION

Figure 1:
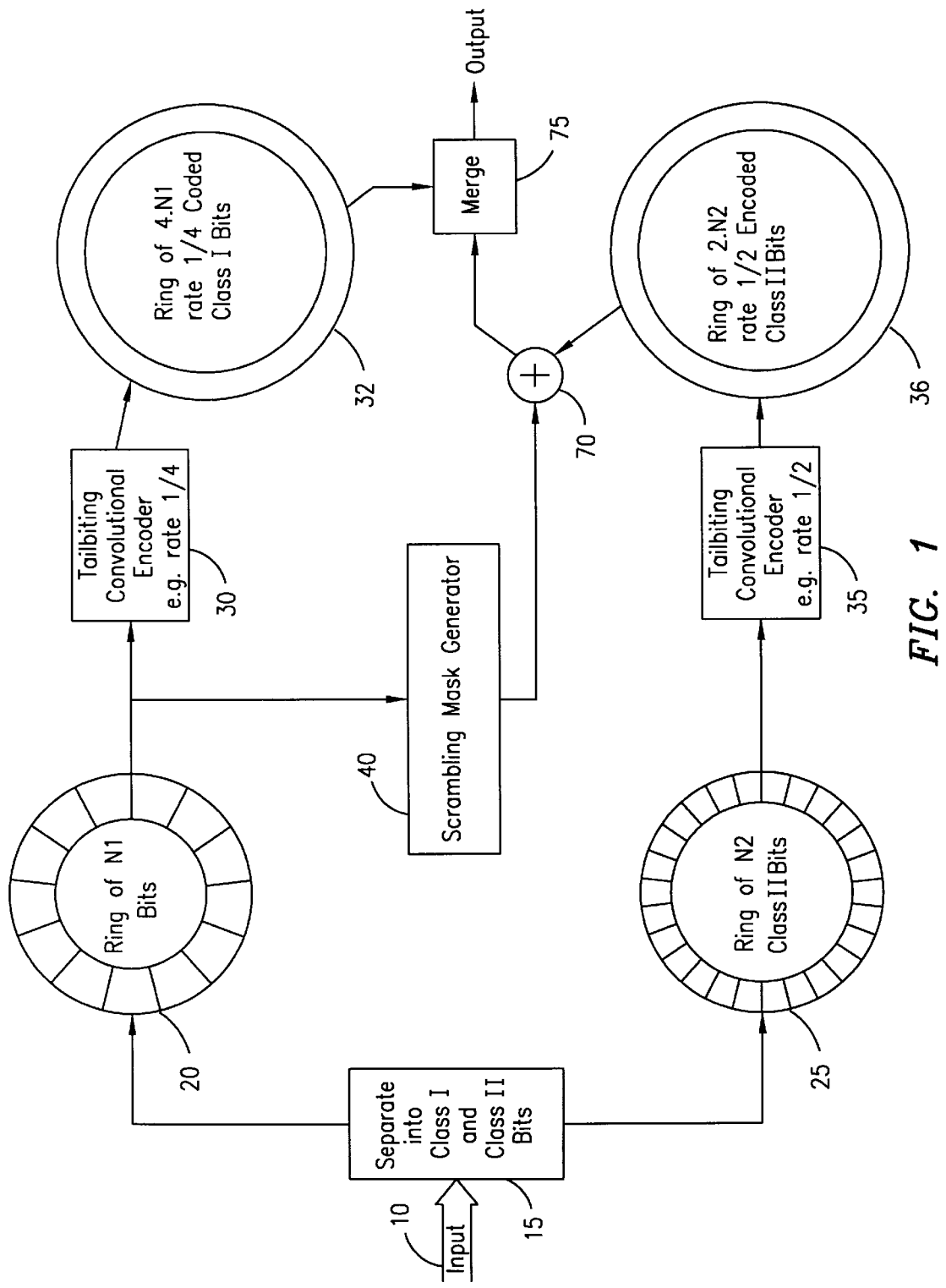
FIG. 1 is a diagram of a transmitter encoder according to the present invention.

Referring now to the drawings, and more particularly to FIG. 1, there is illustrated a block diagram of a coding transmitter of the present invention. For purposes of the following discussion, the encoding will be described with respect to speech data, wherein the most important data bits consists of Class I speech data and the less important data bits consists of Class II speech data. However, it should be realized that the present invention is capable of being utilized with any two groupings of data bits wherein a user desires to protect one of the groups of data bits using the second group of data bits.

A group of data symbols 10 consisting of N1 Class I bits and N2 Class II bits are input into a separator 15 to separate the group of data symbols into a first group of N1 Class I bits 20 and a second group of N2 Class II bits 25. The Class I bits 20 are encoded using a convolutional encoder 30. For example, the convolutional encoder 30 comprises a rate ¼ tailbiting convolutional encoder. A rate ¼ tailbiting convolutional encoder 30 processes N adjacent bits (the constraint length) within the Class I bits 20 to produce four output bits. The N adjacent bits are then shifted 1-bit position before generating another 4-bit output. This process continues until the adjacent bits have been moved entirely through the Class I bits. This process ultimately provides four times the original number of bits that are provided to the encoder 30.

The Class II bits 25 are encoded using a second convolutional encoder 35. In one embodiment, the second convolutional decoder 35 comprises a rate ½ convolutional encoder operating similarly to the rate ¼ rate convolutional decoder, except that the decoder only produces two output bits per each shift cycle of a selected group of N adjacent bits from the Class II data bits. Thus, only twice the number of originally supplied Class II bits 25 are produced. In a preferred embodiment, the first convolutional encoder is a rate ⅕ tailbiting encoder and the second convolutional coder is a rate ⅓ convolutional encoder. Furthermore, the coded bits from the first (rate ⅕) convolutional encoder are divided into two equal groups by puncturing each group representing a rate ⅖ths punctured code, while the coded bits from the second (rate ⅓) convolutional decoder are punctured or divided into two equal groups giving two rate ⅔rds codes. One of the rate ⅖ths coded groups is then combined with one of the rate ⅔rds coded groups and transmitted by a first means while the other rate ⅔rds and rate ⅖ths groups are combined and optionally transmitted by a second means, such as a diversity means. A receiver receives transmissions by the first means and optionally transmissions by the second means and decodes the received signal.

The number of adjacent bits N selected by the encoders 30, 35 is referred to as the constraint length. The constraint lengths of the encoders 30, 35 do not have to be the same. Longer constraint lengths provide more error correction capability but require more complex decoders. The error correction performance is more greatly influenced by the code rates (¼ and ½, respectively) for the convolutional encoders 30 and 35. The code rate is the amount of redundancy added by the coding process. For example, the rate ¼ coder quadruples the number of transmitted bits, while the rate ½ coder doubles the number of transmitted bits.

Figure 2:
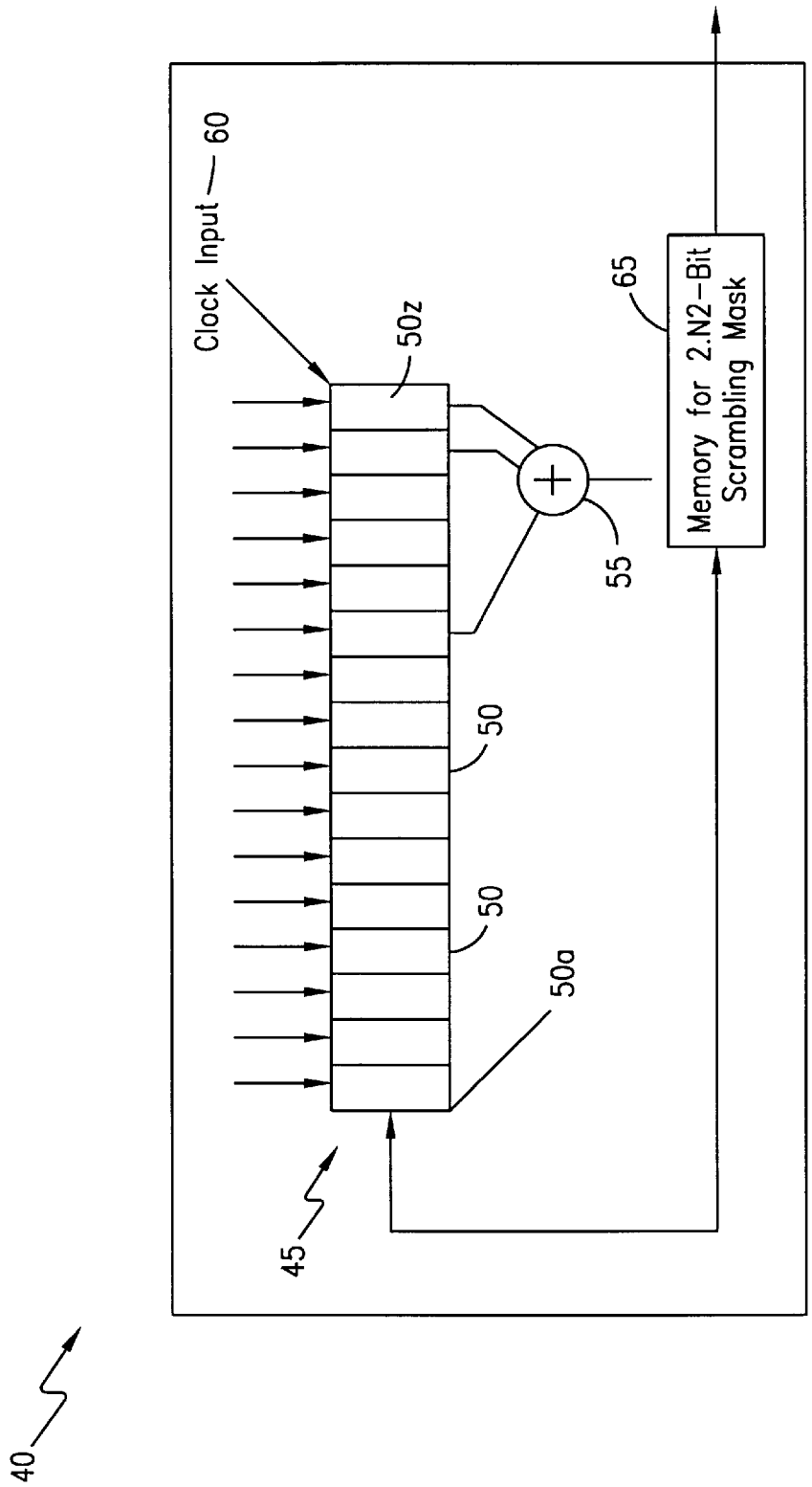
FIG. 2 illustrates one embodiment of a shift register.

The uncoded Class I bits 20 are also input to a scrambling mask generator 40. The scrambling mask generator 40 produces a scrambling mask having a number of bits equal to the bits produced by the second convolutional encoder 35. The coded Class II bits may be scrambled by exclusive-"or"ing a scrambling mask. The scrambling mask is calculated in a deterministic manner from the provided Class I bits 20. While the scrambling mask may be generated by any number of methods, one technique for generating the scrambling mask is illustrated in FIG. 2. The scrambling mask generator 40 comprises a shift register 45 including N1 serially connected stages 50. The serially connected stages 50 are initially loaded using the N1 Class I data bits. Feedback logic circuitry 55 combines bits from selected stages 50 to produce a feedback bit. A clock pulse 60 is applied to the register 45 causing data bits in the register to shift 1-bit to the right such that the feedback bit is clocked into the left most stage 50a and the right most stage bit 50z falls out to the right.

A memory 65 records the feedback bit after each of 2*N2 clock pulses to produce a 2*N2 bit scrambling mask. The memory 65 can alternatively record the bit falling out of the register stage 50z or any other function of the bits in the register 45. The memory 65 does not need to record a bit for every clock pulse applied to the register 45. For example, 23 clock pulses could be applied to the register 45 followed by the memory 65 recording 8-bits selected from the register. This process will continue until at least 2N2 bits have been recorded. Any method of producing a pseudo-random bit pattern starting with the Class I bits may be utilized as long as any change to the Class I bit pattern results in approximately 50% of the generate scrambling mask being different from the originally supplied Class I bits.

The generated scrambling mask is added to the coded Class II bits 36 at an adder 70 using modulo-2 (exclusive-or) addition. The bit-by-bit (symbol-by-symbol) modulo-2 addition insures that single transmission (errors) of the scrambled and coded Class II bits remain a single error after unscrambling at the receiver. Alternatively, error extension may be prevented using bit transposition instead of bit-by-bit addition. In an implementation utilizing bit transposition, the encoded Class II bits 36 would be reordered in dependence of the Class I bits 20. This can, for example, be accomplished by using the Class I bits 20 to initialize a PRN generator, the output of which is treated as a sequence of bit indices, indicating which coded Class II bit shall be transmitted in the next available bit position. After scrambling, the coded Class I bits 32 and the encoded and scrambled Class II bits 36 are interleaved at an interleaver 75. Optionally, further scrambling (not shown) may be utilized prior to transmission to provide additional privacy.

Figure 3:
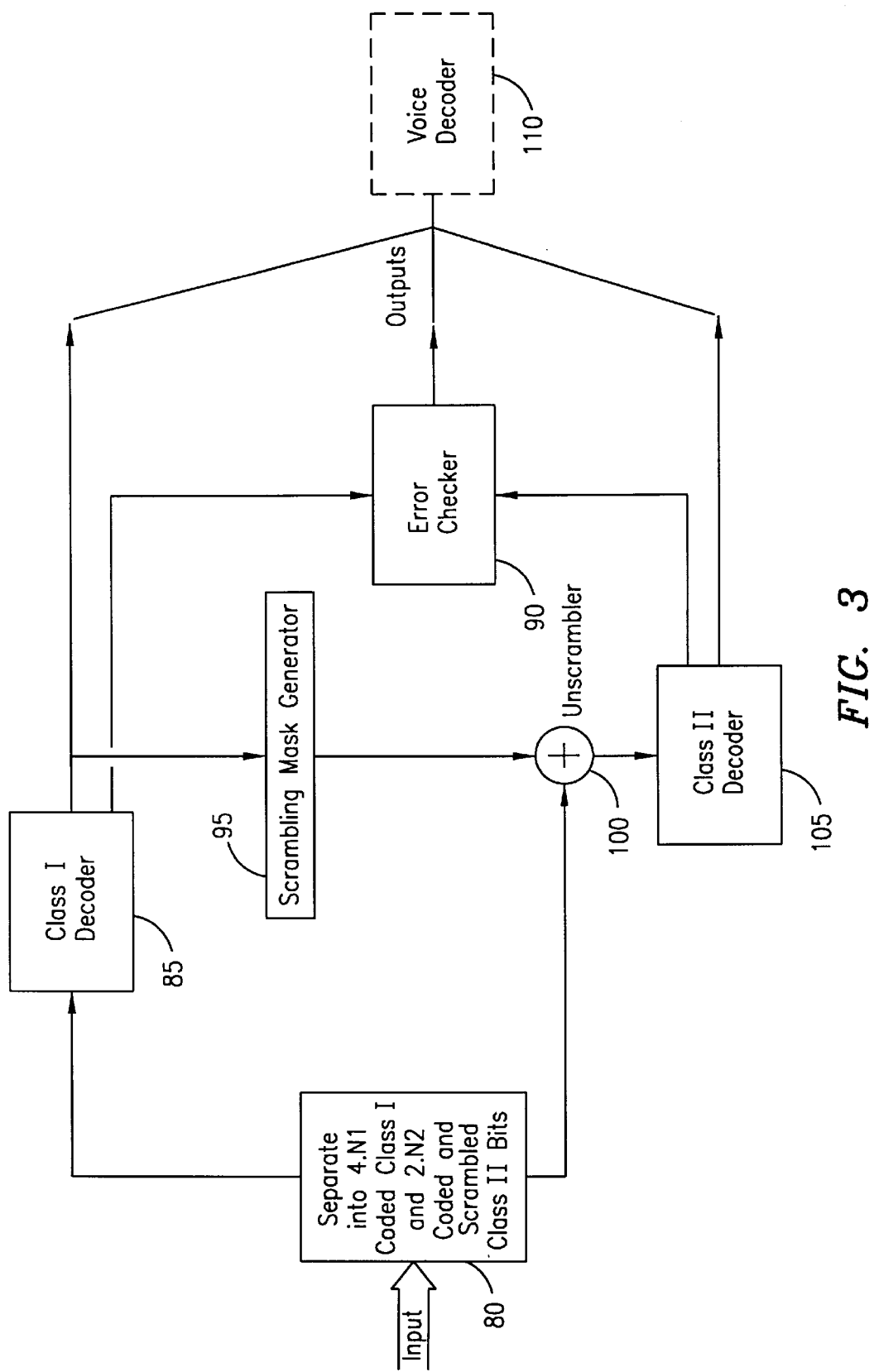
FIG. 3 is a diagram of a receiver decoder according to the present invention.

Referring now to FIG. 3, there is illustrated a decoder for decoding the signals generated by the encoding apparatus of FIG. 1. A received signal including interleaved encoded Class I signals 32 and scrambled and encoded Class II signals 36 is provided to a deinterleaver 80 for separation. The separated, encoded Class I signals 32 are processed by a decoder 85 to recover the Class I bits 20 together with a first decoding quality indicator provided to error checker 90. The decoder 85 is configured to decode whatever coding scheme was implemented by the encoder 30 (FIG. 1).

The decoded Class I bits 20 are provided to a scrambling mask generator 95 wherein the scrambling mask previously described with respect to FIG. 1 is regenerated. The regenerated scrambling mask is subtracted from the scrambled and encoded Class II bits 36 at a descrambler 100 on a bit-by-bit (symbol-by-symbol) basis to descramble the encoded Class II bits. Alternatively, if bit transposition is used for scrambling, the decoded Class I bits are used to control descrambling of the coded Class II bits by reordering them. The unscrambled, encoded Class II bits 36 are then processed by a decoder 105 to recover an estimate of the Class II bits 20 along with a second decoding quality indicator of the decoding process. The decoding quality indicators are, for example, cumulative path metrics indicative of the logarithm of the likelihood that the decoded data sequence is the correct sequence. The decoding quality indicators are supplied to error checker 90. The decoder 105 is configured to decode whatever coding scheme was implemented by the encoder 35 (FIG. 1). The error checker 90 determines, using both quality indicators, whether the decoded Class I bits are right or wrong.

The effect of the scrambling mask is to change the encoded Class II bits 36 from a valid coded output of the encoder 35 to an invalid output, until the scrambling process is reversed at the receiver. However, in order for the scrambling process to be reversed, a correct knowledge of the Class I bits upon which the scrambling depends is necessary. If an error occurs at the receiver in decoding the Class I bits, the scrambling process will not be undone correctly, and the encoded Class II bits will not be properly descrambled. The incorrectly descrambled Class II bits will not represent a valid encoded output that could have been generated by the encoder 35. The corresponding decoder 105 detects this and provides a clue that an error is likely to have occurred in decoding of the Class I bits by means of the decoding quality indicator having a value indicative of low likelihood.

Thus, the encoding/decoding system of FIGS. 1 and 3 provides a means whereby decoding of a second group of bits (Class II bits) can assist in determination of whether a prior decoding of a first group of bits (Class I bits) was successful. This is useful when the number of bits in the second group is much larger than the number of bits in the first group, and therefore the decision on whether or not the encoded Class II bits represents a valid encoder output is based on a much greater number of bits than a decision based only on the smaller number of Class I bits.

The error checker 90 utilizes the decoding quality indicators from both of the decoders 105 and decoder 85 to determine the likelihood of errors within the decoded Class I bits and provides an error indication for further processing. The further processing may comprise a voice decoder 110 (shown in phantom) for reproducing a voice waveform from the decoded Class I and Class II bits. The error indication is used by the voice decoder 110 to mask error artefacts when the error checker 90 indicates a high likelihood of errors within the decoded Class I bits.

One method in which the error checker 90 may determine the likelihood of errors within the decoding of the Class I bits 20 will now be described. It should of course be realized that a variety of methods for processing likelihood metrics can be devised within the same spirit of the invention. Decoders 85 and 105 estimate the most likely Class I and Class II bit sequences present within the received signal using soft-decision, sequential maximum likelihood decoding (MLSE) in which the received coded bits are not quantized to zero or one, but are determined as soft-values indicating a degree of "one-ness" or "zero-ness" of the coded bits. An MLSE decoder (not shown) within the error checker 90 hypothesizes all possible bit patterns of a length equal to the constraint length of the error correction code and determines the coded bit patterns that should result. Each coded bit pattern is then compared with a corresponding soft-value pattern. If the polarities agree, the magnitude of the soft-value is subtracted from a likelihood metric for the corresponding hypotheses. Otherwise, the magnitude of the soft-value is added to the metric of the corresponding hypotheses.

The hypothesized bit pattern is then extended by one new symbol, doubling the number of patterns, but the number of patterns is also condensed by a factor of two by selecting between the pair of patterns that differ only in their oldest bit position and retaining the pattern of each pair that has a lower metric. When all information bits have been hypothesized, the lowest cumulative metric indicates the most likely symbol sequence, and the metric is the negative of the correlation between the received signal and the coded version of that sequence.

When a tailbiting convolutional decoder is used, the cycle of bits may be decoded starting at any point within the cycle, and the process continues until at least one full cycle of decoding has taken place. Since tailbiting decoders do not start and end at a known state, the first and last bits decoded tend to exhibit a higher error rate. Therefore, it is common to allow the decoder to complete, for example, two complete cycles and to select the set of bits decoded in the middle of the two cycles. The resulting cumulative metric would then be summed over the two cycles and not just for the middle bits. Therefore, when a tailbiting decoder is allowed to overrun, the metric used as a negative of the correlation value should be computed as a difference between the cumulative metric just before the first of the finally selected output bits was decoded and the metric after decoding the last of the selected output bits. This gives a correct measure of how much the metric grew due to processing the selected output bits.

Other methods to determine the quality indicator could be used wherein the final decoded bit sequence can be Aft: correlated retrospectively with the stored, received soft-values to obtain a correlation value which is divided by the number of coded bits to obtain an average correlation value. If the sequence is correct, the average correlation value would be equal to the average received signal magnitude. A separate accumulation thus sums the squares of the received soft-values, divides by their number, and takes the square -root to obtain the root-mean-square (RMS) average of the received signal amplitude.

The average correlation value is divided by the RMS average signal value to obtain a decoding quality indicator that lies between zero and one. A value of one indicates that no noise was present and no errors were detected in the decoding. A value less than one indicates the amount of noise present in the received signal and the likely number of decoding errors that were made. An inverse quality indication which is one minus the above-determined value may be of more value. The inverse of quality indication may be quantized into one of twenty bands of width 0.05, thus giving a quantized inverse quality indicator between one and twenty where one denotes very reliable decoding and twenty denotes very unreliable decoding.

Figure 4:
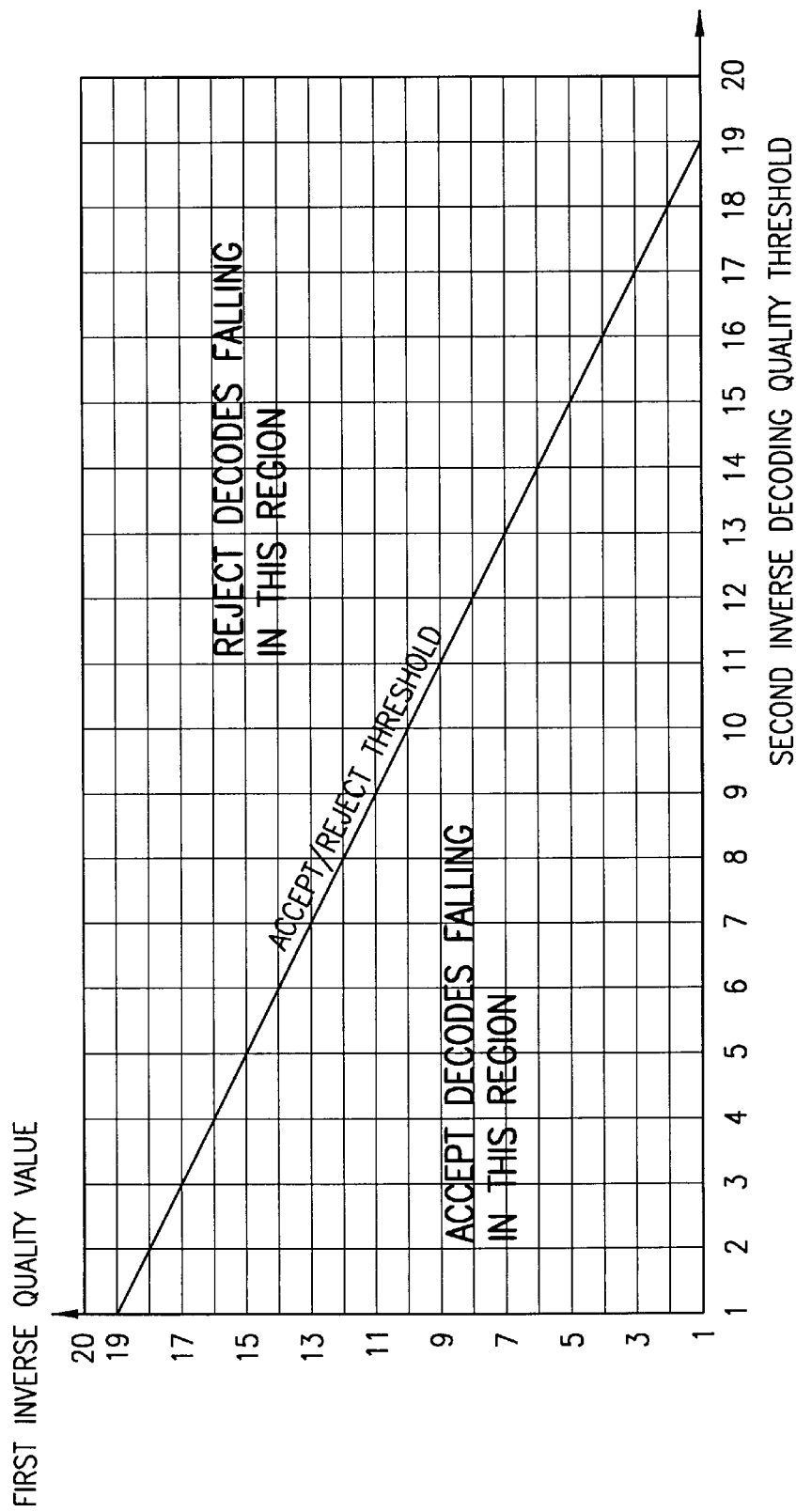
FIG. 4 illustrates the application of an accept/reject threshold to the sum of the inverse quantized quality indicator.

Both decoders 85 and 105 of FIG. 3, can be caused to output an inverse quality indicator to error checker 90. Error checker 90 then makes a decision based on both quality indicators to determine whether the Class I bits were likely to have been decoded corrected. For example, it may be decided that decoding was most likely correct as long as the sum of the inverse quantized quality indicators defined above is less than a selected threshold. FIG. 4 graphically illustrates the application of an accept/reject threshold to the sum of the inverse/quantized quality indicators. The possible values, 1–20 of the first inverse quality indicator for decoding Class I bits are plotted up the vertical axis. The second inverse quality indicators for decoding Class II bits is plotted along the horizontal axis.

The acceptance threshold for any decoding operation equals the sum of the Class I and Class II inverse quality indicators and shall not exceed 20. This corresponds to the sloping line in FIG. 4 which passes through all grid points whose coordinates add to the exemplary threshold of 20. Thus, a decode operation falling above and to the right of this line has a sum of quality values exceeding 20 and is rejected (i.e., classified as erroneous decoding) while decode operations falling below and to the left of the threshold line are accepted. Of course, the accepted/rejected line may not be a straight line but can be a curved line passing through predetermined grid points.

Figure 5A:
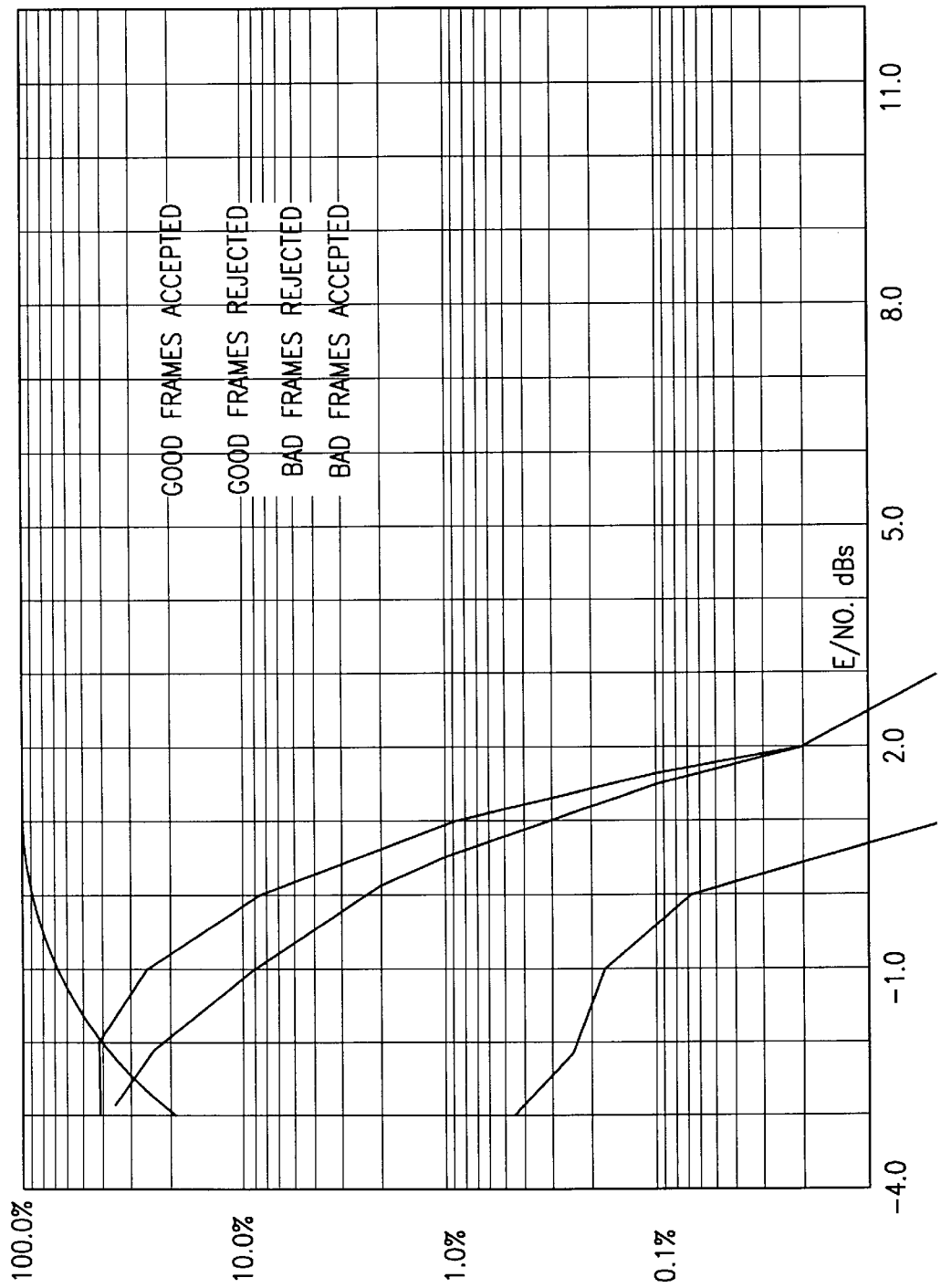
FIGS. 5a–5f illustrate the relative probabilities of acceptances and rejections for various threshold levels.
Figure 5B:
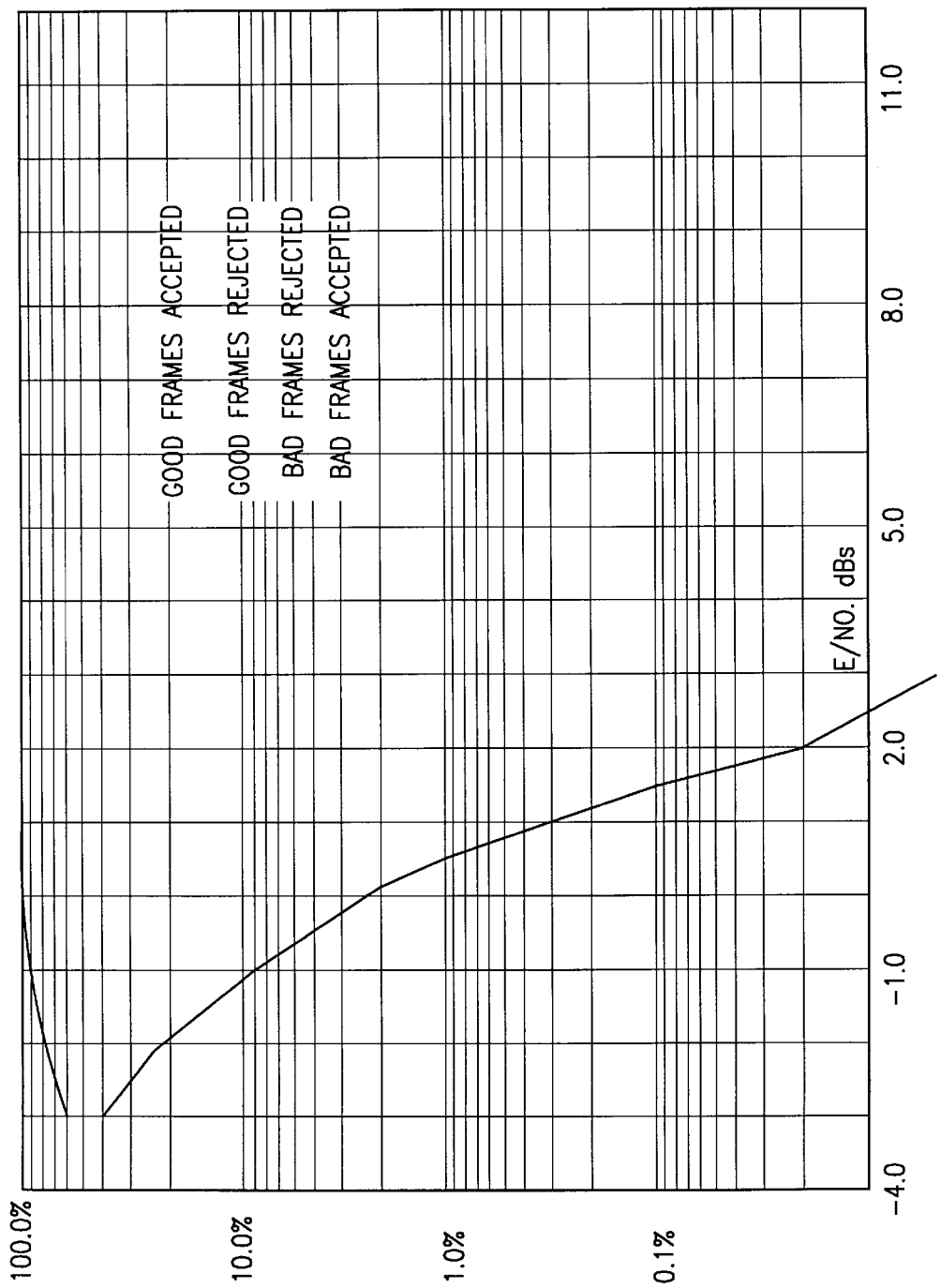
Figure 5C:
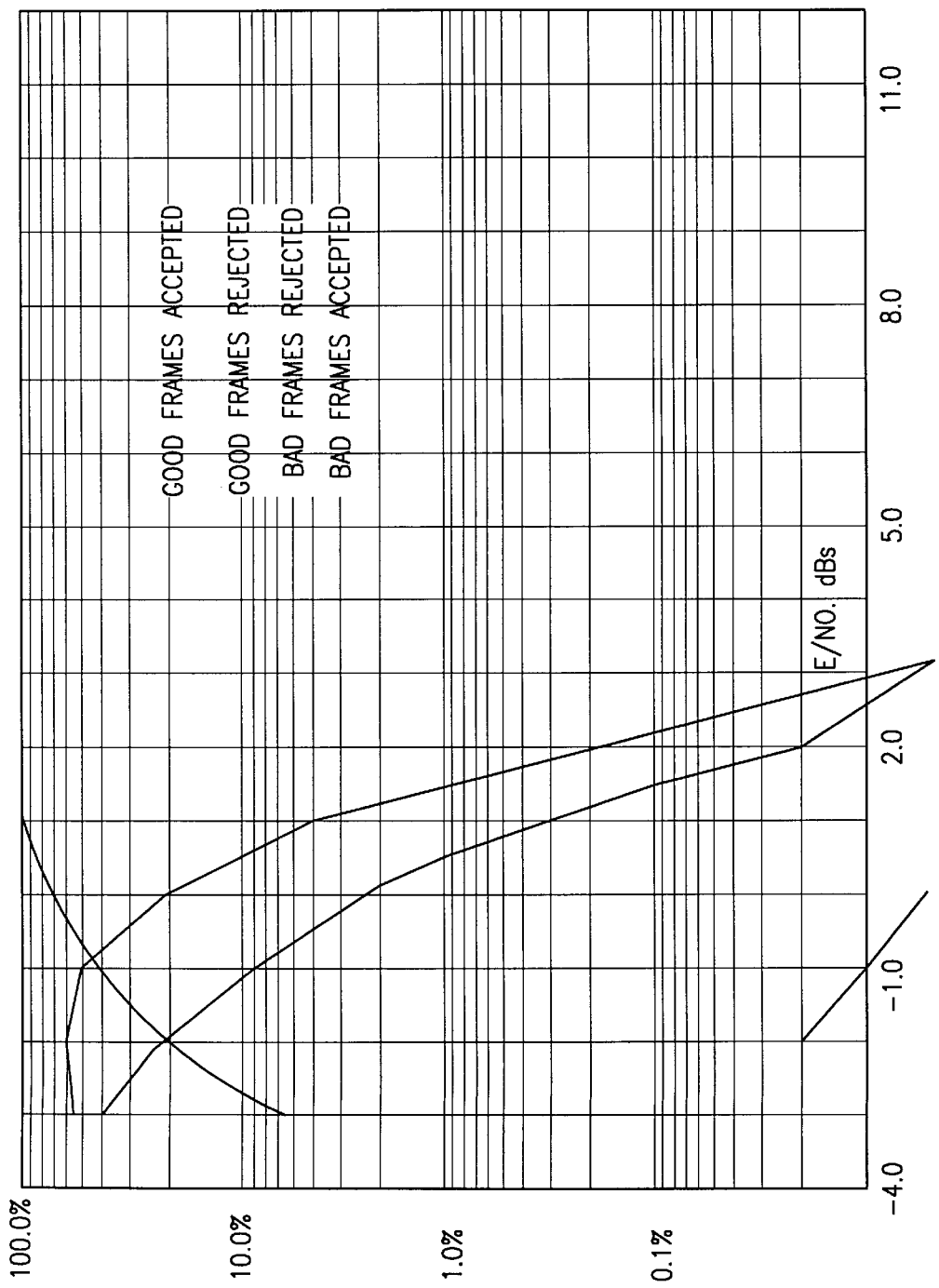
Figure 5D:
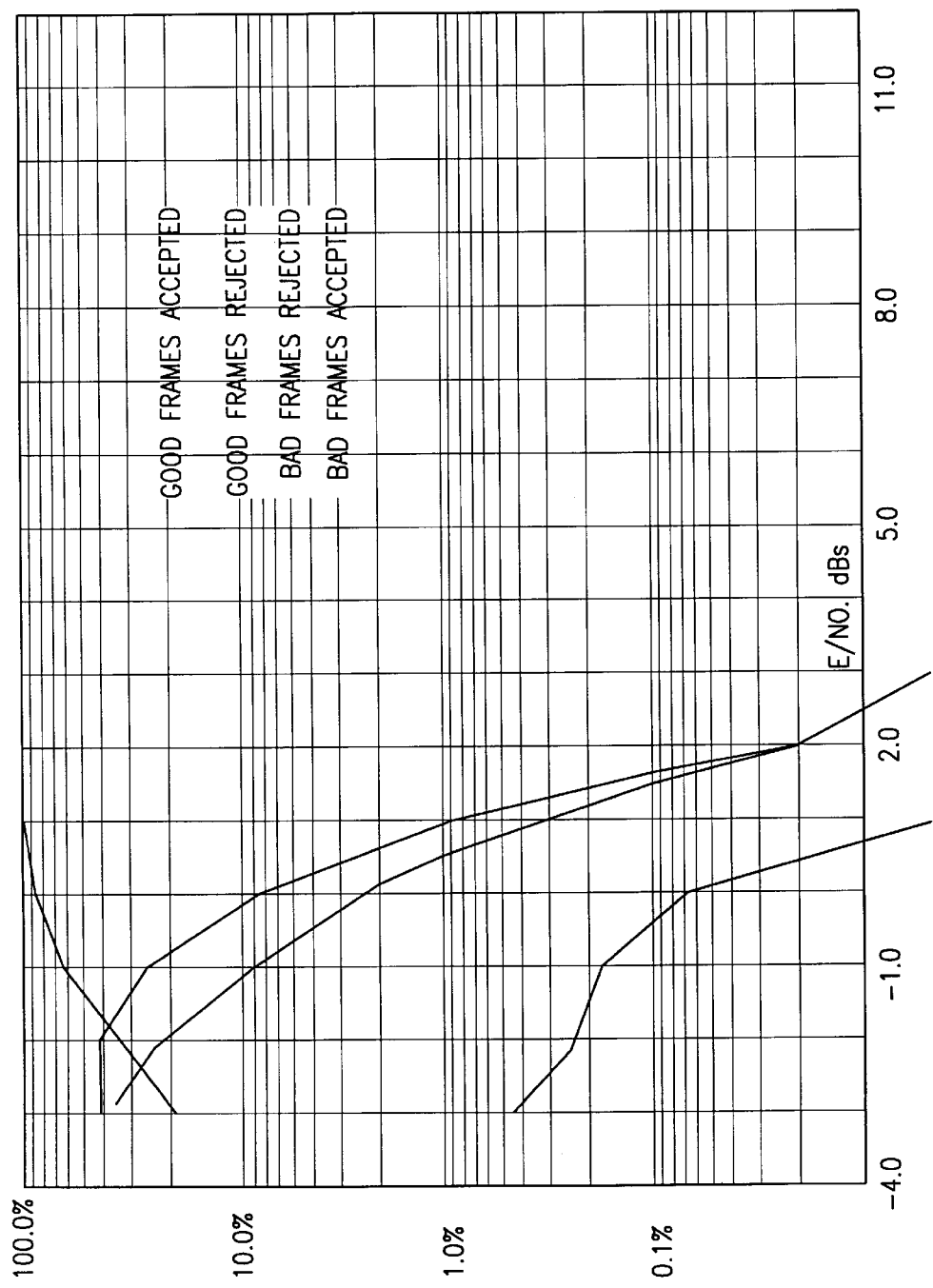
Figure 5E:
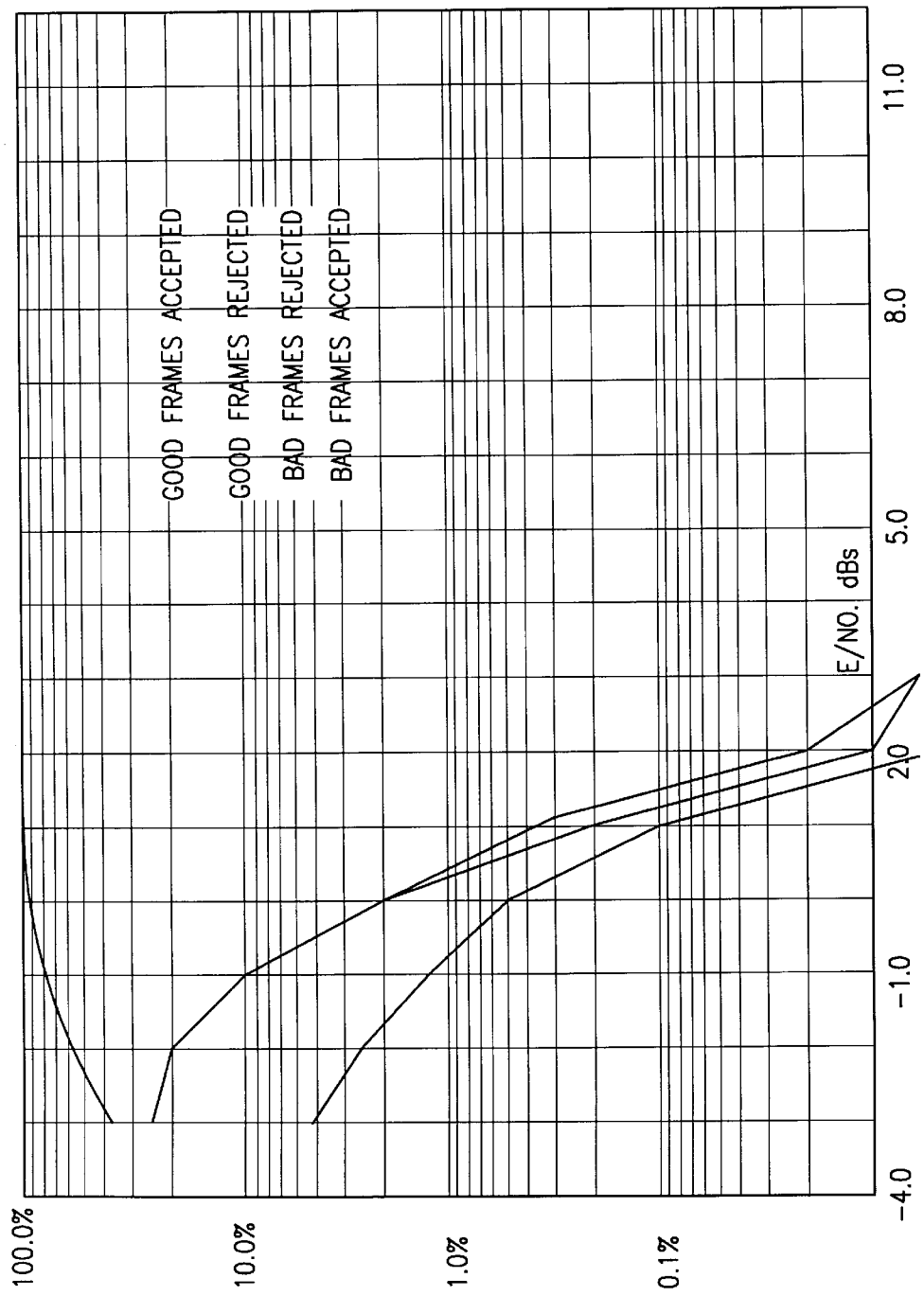
Figure 5F:
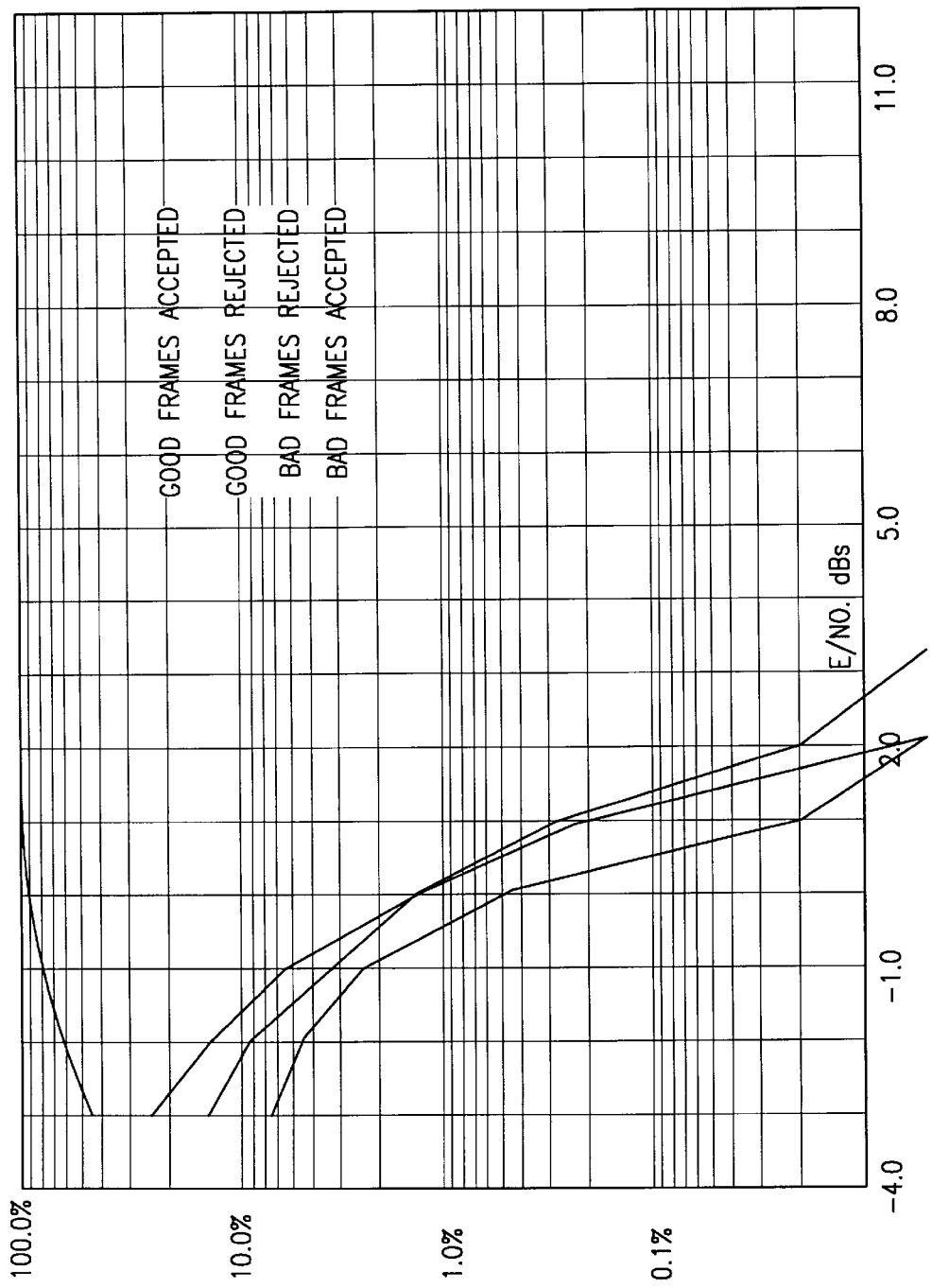

The curved line should be chosen to give the best compromise between correctly rejecting erroneous decodings, falsely rejecting correct decodings, and falsely accepting erroneous decodings. The remaining events comprising correct acceptances of correct decodings. The relative probabilities of these four types of events are plotted for different accept/reject thresholds in FIGS. 5a–5f. FIG. 5a illustrates the results for a particular type of coder and matching decoder with the following parameters:

1. Speech coder outputs 72 bit frames every 20 milliseconds, separated into twelve Class I bits and sixty Class II bits;
2. Twelve Class I bits are encoded using a rate 1/5 constraint length 7, tailbiting convolutional encoder to give 60 coded bits;
3. Sixty Class II bits are encoded using a rate 1/3 constraint length 7, tailbiting convolutional encoder to give 180 coded bits; and
4. The 60 plus 180 coded bits are transmitted over a noisy channel at various signals to noise ratios after decoding; a threshold of 18 is placed on the sum of the inverse quantized quality indicators to determine when a frame should be accepted or rejected.

Using a decoder four types of events can occur. Desirable events include frames that are decoded correctly and are accepted by the error checker 90 or frames that are decoded with errors in the Class I bits are rejected by the error checker 90. Undesirable results include frames that are decoded correctly and are erroneously rejected, or frames that are decoded with errors in the Class I bits and are a-erroneously accepted by the error checker 90.

FIG. 5a illustrates the probability for the four types of events as a function of signal to noise ratio (EB/NO) for the above parameters. It is seen that frames having errors in the Class I bits are mostly rejected, the residual number slipping through the error check being in the 0.1% to 1% region. The region of frame erasures which the voice coder can bridge by artificial reconstruction of the missing segment is up to 10% while preserving useful voice quality. To see how the probabilities vary with the choice of rejection threshold, the following figures may be viewed. FIG. 4a illustrates no error detection wherein all frames are accepted, FIG. 4b illustrates rejection only over a threshold of 20, FIG. 4c illustrates rejection only over a threshold of 19, FIG. 4e illustrates a rejection only over a threshold of 18, and FIG. 4f illustrates rejection only over a threshold of 17.

The number of frame erasures due to good frames being erroneously rejected by the error checker is shown in FIGS. 4a–4f to be sometimes larger than the number of frames rejected due to errors. It is a statistical hazard of any error checking criteria that good frames sometimes fail to check, thus adding to the number of frames lost. However, because the present invention does not add overhead in the form of CRC for the purposes of error detection, all the transmitted energy is concentrated upon error correction, and thus, the number of frames lost is lower than if the CRC had been used. The tradeoff between lost frames due to erroneous rejection of good frames and erroneous acceptance of bad frames can be varied by choice of the rejection threshold to adapt the performance to a particular type of information source coder and decoder.

Figure 6:
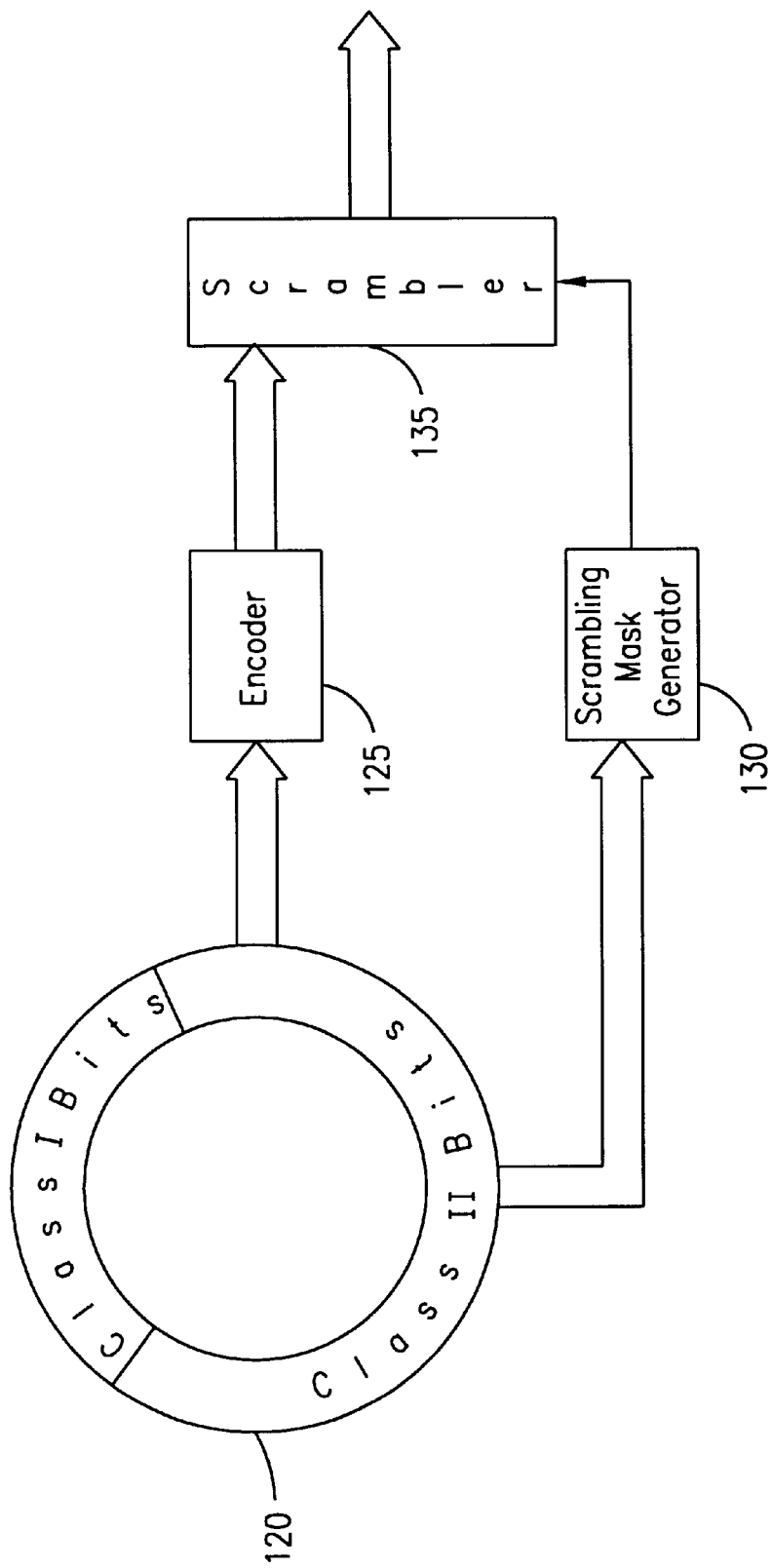
FIG. 6 is an alternative embodiment of a transmitter encoder.

Referring now to FIG. 6, there is illustrated an alternative embodiment of the encoder of the present invention wherein rather than grouping the Class I and Class II bits as two separate groups of data symbols and encoding and decoding them separately, the Class I and Class II bits are grouped together in a single data grouping 120 that is clearly separated into the Class I and Class II bits, and the grouping is encoded using a single convolutional encoder 125. The convolutional encoder 125 preferably comprises a tailbiting convolutional encoder having a variable rate depending on whether the device is encoding Class I or Class II bits. A variable rate convolutional encoder is produced by computing, for each data bit encoded, a larger number of coded bits than needed and selection of a variable portion of them for transmission. The coded bits not selected for transmission are said to have been "punctured out." The number of coded bits punctured out can be varied continuously from bit-to-bit in a manner pre-agreed between transmitter and receiver.

Since a variable coding rate is used, whenever the encoder 125 is calculating coded bits for Class I bits, the number of coded bits generated will be greater than when the encoder is calculating coded bits from Class II bits. When a single, punctured convolutional encoder 125 is used, there will be times when the encoder 125 is processing all Class I bits, all Class II bits or a mixture of Class I and Class II bits. During these times the encoder selects the number of coded bits for transmission in dependence on the class of bits being encoded. The number of bits selected by the puncturing scheme may have to vary between more than just two values (e.g., 4 and 2 or 5 and 3) in order to effect a "scarf joint" between encoding of Class I bits using one code rate and Class II bits using a second code rate. When Class II bits are being encoded by the encoder 125, a scrambling generator 130 generates a scrambling mask from the Class I bits, as previously described and the mask, is added with the encoded Class II bits at a scrambler 135. Alternatively, the scrambling generator controls the order in which coded Class II bits are inserted into the transmitted stream. The encoded Class I and Class II bits are forwarded for transmission to a receiver.

Figure 7:
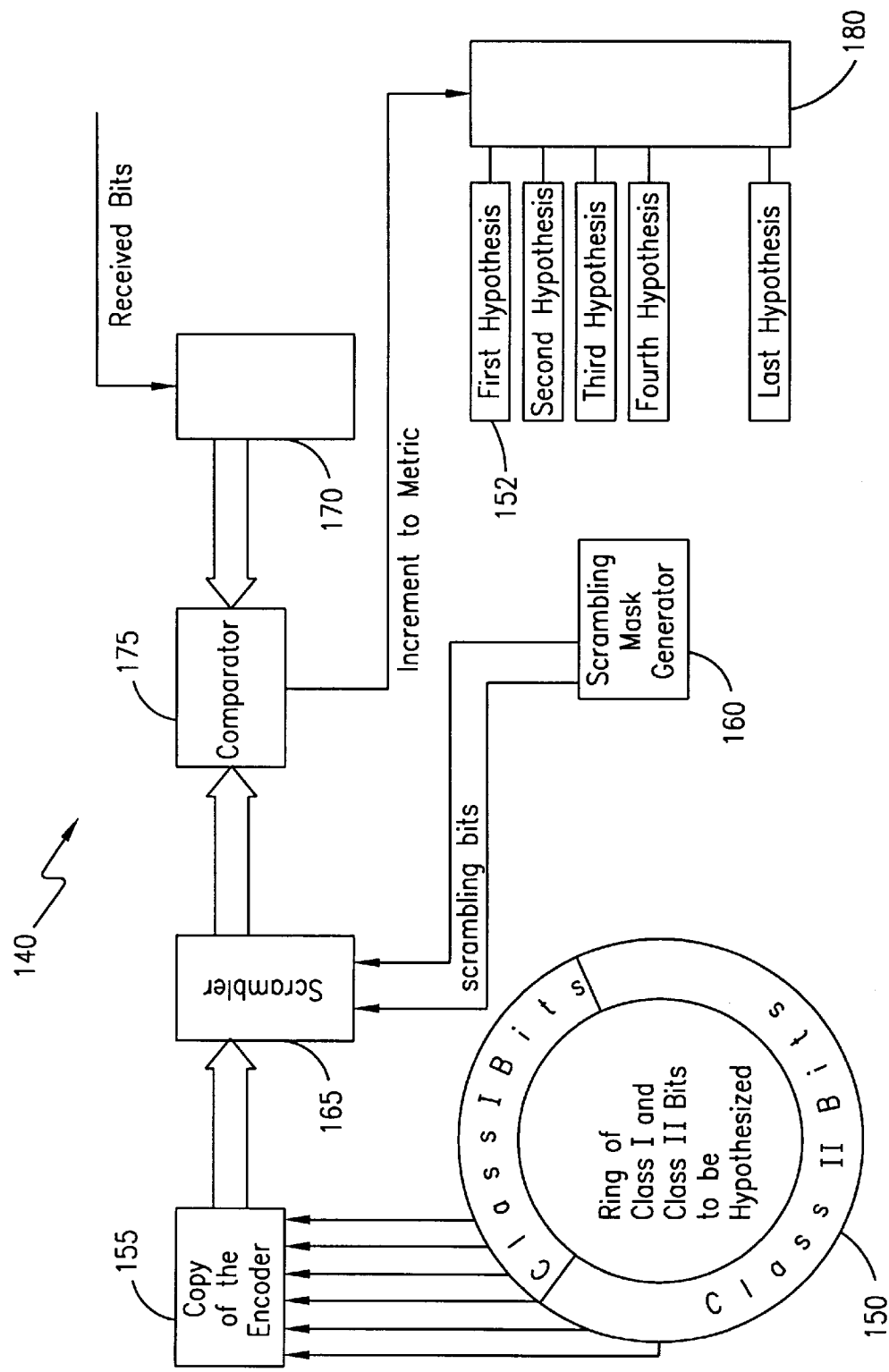
FIG. 7 is an alternative embodiment of a receiver decoder.

Referring now to FIG. 7, there is illustrated a decoder 140 for decoding a signal received and encoded in accordance with the encoder illustrated in FIG. 4. A grouping 150 of Class I and Class II bits is to be hypothesized. The form of the desired decoded output is known apriori to consist of a given number (N1) of Class I bits in certain given positions and a second given number (N2) of Class II bits in other given positions. The known MLSE decoder (not shown) can start by hypothesizing any N consecutive decoded bits where N is the constraint length minus one. Likelihood metrics are accumulated as previously described for each of the $2^{(N-1)}$ possible bit patterns, by hypothesizing, for each bit pattern, first that the Nth bit is a 1, then that the Nth bit is a 0, encoding each pattern (now extended by the Nth bit to contain N bits; i.e., equal to the constraint length of the known code) and comparing the encoded pattern to the received signal samples. The smaller of each pair of metrics corresponding to two patterns differing only in their 1st bit positions, bits 2,3,4, . . . , N all agreeing, is then retained along with the corresponding pattern. In this way, the number of retained patterns is now once again $2^{(N-1)}$ and the first of the N bits has now been bound to the definite, retained value for each pattern, while bits 2,3, . . . , N now exhibit all possible $2^{(N-1)}$ combinations.

The process continues to hypothesize successively the (N+1)th bit, the N+2)th bit and so on, until all bits have been decoded. At each stage, when the most recently hypothesized N bits are reencoded for comparison with received signal samples, the reencoding process used is selected according to whether the N bits are Class I Bits, Class II bits, or a mixture, in the same, known manner used by the transmitter for encoding Class I bits, Class II bits or a mixture. In other words, the bit positions of Class I and II bits and the respective encoding processes are agreed apriori between the transmitter and receiver.

When practicing the invention, the above-described decoding process is begun at the Class I bit position. A copy of encoder 155 generates a number of coded bits from each successive shift of x number of adjacent bits (constraint length) within the data group 150. The illustrated position of FIG. 5 from which adjacent bits are selected spans both Class II and Class I bits. However, the first selected starting position should be a position that does not generate any coded bits that are scrambled (i.e., Class I bits and not Class II bits).

Thus, decoding begins by selecting all possible hypotheses resulting from a set of adjacent bits that lie at a position in the data grouping 150 that will not produce coded bits that have been scrambled. During this time period, a scrambling mask generator 160 generates a null pattern and a scrambler 165 performs a null-scrambling operation. The coded bits produced by the copy of encoder 155 are compared with received bits from a receive buffer 170 at a comparator 175. The receive buffer 170 receives the encoded signal generated by the encoder 124 of FIG. 4. The comparison between the encoded bits and received bits by the comparator 175 generates a metric for each hypothesis of the group of adjacent bits. The metrics are stored in association with their corresponding hypotheses in a memory 180. Various hypotheses for the group of adjacent bits are stored in a path history memory 152.

The selected group of adjacent bits from the data group 150 is then advanced throughout the Class I bit positions that do not include scrambled bits, comparing at each position the coded bits generated with corresponding received bits from the received buffer 170 at the comparator 175 to compute increments to the metric value. After rotating the adjacent bits selection through each position including only Class I bits, the hypotheses memory 180 contains a number of different hypotheses for all Class I bits and an associated partially accumulated metric.

The Class I bit hypotheses are now used within the scrambling mask generator 160 to produce scrambling bits which operate on the output of the encoder 155 by means of the scrambler 165 to generate expected scrambled coding bits for the scrambled Class II data bit. Each hypotheses within the memory 152 must now be extended 1-bit at a time giving rise to coded and scrambled Class II bits which are then compared with corresponding received bits from the received buffer 170 and comparator 175. The resulting comparison provides a delta metric or increment to the existing metric for the selected hypotheses. When all hypotheses have been advanced 1-bit and a new cumulative metric produced, the number of hypotheses will have doubled by addition of the new bit and then halved upon selection between pairs of states differing only in their oldest bit according to the Viterbi decoding principle.

Decoding continues in this manner until all bits of data group 150 that include scrambled coded bits are hypothesized, and the encoder has moved full circle to select the initial starting group of bits once again. Decoding continues for a second cycle with the Class I bits not requiring their coded bits to be descrambled, and the Class II bits requiring scrambling using the already hypothesized Class I bits from the same machine-state. Decoding continues circularly until it is deemed that no further improvements will result. The hypothesis having the lowest cumulative metric is selected, and a decoded set of Class I and Class II bits is extracted from the middle of the multiple decoding cycles so as to avoid end-effects.

The extracted bits can be used retrospectively to process received signal samples to generate the decoding quality indicators if partial metrics were not saved during decoding. If partial metrics were saved during decoding, the quality indicator for decoding the Class I bit is derived from the difference in the partial metric just before the first Class I bit was decoded and the partial metric after decoding the last Class I bit. Likewise, the quality indicator for Class II bit decoding is derived from the difference in the partial metric just before the first Class II bit was decoded and the partial metric after decoding the last Class II bit. The quality indicators are of course calculated from partial metrics stored against the best hypotheses, i.e., the machine-state with the lowest total metric, and are jointly processed by an error checker 200 to check the likelihood that the decoded Class I bits contained decoding errors.

Although preferred embodiments of the method and apparatus of the present invention have been illustrated in the accompanying Drawings and described in the foregoing Detailed Description, it is understood that the invention is not limited to the embodiments disclosed, but is capable of numerous rearrangements, modifications, and substitutions without departing from the spirit of the invention as set forth and defined by the following claims.

What is claimed is:

1. An apparatus for coding information bits for transmission, comprising:

a separator for sorting the information bits into a first group of information bits and a second group of information bits;

a first convolutional encoder for coding the first group of information bits to produce a third group of coded information bits;

a second convolution encoder for coding the second group of information bits to produce a fourth group of coded information bits, wherein a ratio of the third group of information bits to the first group of information bits is greater than a ratio of the fourth group of information bits to the second group of information bits;

scrambling circuitry for scrambling the fourth group of coded information bits in dependence on the first group of information bits to produce a fifth group of scrambled, coded information bits; and a transmitter for transmitting each of the fifth group of scrambled, coded information bits and each of the third group of coded information bits in a predetermined transmission sequence.

2. The apparatus of claim 1 wherein the scrambling circuitry further comprises a pseudorandom sequence generator for generating a sequence of scrambling bits from an initial group of bits dependent on the first group of information bits.

3. The apparatus of claim 2 wherein the sequence of scrambling bits contains a number of bits at least equal to the fourth number of coded information bits.

4. The apparatus of claim 3 wherein the scrambling bits are combined bitwise with corresponding bits of the fourth group of coded information bits to produce the fifth group of scrambled, coded information bits.

5. The apparatus of claim 3 wherein a first portion of the scrambling bits are combined bitwise with a corresponding first portion of the fourth group of coded information bits and a second portion of the scrambling bits define a scrambling order in which the fourth group of coded information bits are arranged.

6. The apparatus of claim 4 wherein the combining comprises an exclusive "or" operation.

7. The apparatus of claim 2 wherein the sequence of scrambling bits defines a scrambling order for rearranging the fourth group of coded information bits to produce the fifth group of scrambled, coded information bits.

8. The apparatus of claim 1 wherein the first convolutional encoder comprises a tailbiting convolutional encoders.

9. The apparatus of claim 1 wherein the second convolutional encoder comprises a tailbiting convolutional encoder.

10. The apparatus of claim 1 wherein the first convolutional encoder comprises a punctured convolutional encoder.

11. The apparatus of claim 1 wherein the second convolutional encoder comprises a punctured convolutional encoder.

12. The apparatus of claim 1 wherein the first and second convolutional encoders comprise:
 a shift register including a number of memory elements;
 logic circuitry for computing a plurality of logical combinations of contents of the memory elements of the shift register;
 circuitry for initializing the memory elements to an initial state using a first portion of the first group of information bits;
 a controller for sequentially shifting the first group and the second group of information bits through the memory elements of the shift register until the memory element returns to the initial state and for selecting prior to each shift a plurality of the logical combinations of the memory elements, the combinations dependant on whether the memory elements of the shift register contain only portions of the first group of information bits or the second group of information bits, the logical combinations comprising the third and the fourth groups of coded information bits.

13. The apparatus of claim 12 wherein the selection of logical combinations for each shift varies according to a predetermined puncturing schedule.

14. An apparatus for receiving a signal and decoding therefrom coded and scrambled information bits to produce a first and a second group of information bits, comprising:
 a first processor for hypothesizing in dependence on a metric value a plurality of first sequences of bits containing the first group of information bits to determine a first sequence of bits with a cumulative metric indicative of a highest likelihood;
 a first re-encoder for re-encoding the hypothesized plurality of first sequences of bits to produce first expected signal samples corresponding to the first group of information bits;
 a first metric accumulator for comparing the first expected signal samples with a corresponding received signal samples and for accumulating a cumulative metric associated with the first expected signal samples based on the comparison;
 unscrambling circuitry for unscrambling the received signal samples corresponding to a second group of information bits based on the determined first group of information bits of highest likelihood;
 a second processor for successively hypothesizing a second bit sequence containing the second group of information bits dependant on a plurality of stored metric values to determine the second bit sequence having a second cumulative metric indicative of a highest likelihood;
 a second re-encoder for re-encoding the hypothesized second bit sequence to produce a sequence of second expected signal samples corresponding to a second group of information bits;
 a second metric accumulator for comparing unscrambled received signal to the sequence of second expected signal samples and for accumulating a plurality of second cumulative metrics based on the comparisons; and
 error indicating circuitry for processing the first cumulative metric indicating highest likelihood with the second cumulative metric indicating highest likelihood to produce an error indicator signal.

15. The apparatus of claim 14 wherein the first re-encoder and second re-encoders comprise convolutional encoders.

16. The apparatus of claim 14 wherein the first and second re-encoders comprise tailbiting convolutional encoders.

17. The apparatus of claim 14 where the first and second re-encoders comprise punctured convolutional encoders.

18. The apparatus of claim 14 wherein the first re-encoder produces a number of expected signal samples having a first ratio to the first group of information bits and the second re-encoder produce a number of expected signal samples having a second ratio to the second group of information bits, wherein the second ratio is lower than second first ratio.

19. The apparatus of claim 14 wherein the unscrambling circuitry further comprises a generator for generating an unscrambling bit sequence from an initial state dependent on the determined first bit sequence of highest likelihood.

20. The apparatus of claim 19 wherein the unscrambling bit sequence determines an order for comparison of the received signal with the expected signal samples by the second metric accumulator.

21. The apparatus of claim 14 where the unscrambling bit sequence comprises at least the same number of bits as the signal samples compared by the second metric accumulation means.

22. The apparatus of claim 21, wherein the means for unscrambling combines each bit of the bit scrambling sequence with a corresponding received signal sample.

23. The apparatus of claim 14 wherein the error indicating circuitry further additively combines the first and the second cumulative metrics and compares the sum with a threshold value to produce the error indicator signal.

24. The apparatus of claim 14 wherein the error indicator circuitry measures the average signal strength of received signal samples.

25. The apparatus of claim 24 wherein the average signal strengths are computed by the first and the second metric accumulators.

26. The apparatus of claim 24 wherein the average signal strengths comprise a root-mean-square measure.

27. The apparatus of claim 14 wherein the error indicator circuitry normalizes the metrics by dividing by a respective average signal strength.

28. The apparatus of claim 27 wherein the normalized metrics define a two-dimensional plane and the error indicator signal depends on whether the signal lies within a first or second region of the plane.

29. An apparatus for receiving a signal and decoding therefrom coded and scrambled information bits to produce a first group of decoded information bits corrected for transmission errors plus an indicator signal warning of the likelihood of uncorrected errors and a second group of information bits corrected for some transmission errors, comprising:

a first processor for successively hypothesizing first sequences of bits containing said first group of information bits in dependence on metric values to determine a first sequence of bits having a first cumulative metric indicative of highest likelihood;

a first re-encoder for re-encoding said hypothesized first sequences of bits to produce sequences of first expected signal samples corresponding to said first group of information bits;

a first metric accumulator for comparing said first expected signal samples with corresponding received signal samples and accumulating said cumulative metrics based on similarity or difference;

a second processor for successively hypothesizing second sequences containing said second group of information bits in dependence on metric values to determine a second sequence of bits having a second cumulative metric indicative of highest likelihood;

a second re-encoder for re-encoding said hypothesized second sequence of bits to produce a sequence of second expected signal samples corresponding to said second group of information bits;

scrambling circuitry for scrambling said second expected signal samples corresponding to said second group of information bits using said determined first sequence of information bits of highest likelihood;

a second metric accumulator for comparing said received signal samples with said scrambled expected signal samples and accumulating said second cumulative metrics based on similarity or difference; and error indicator circuitry for processing said first cumulative metric indicative of highest likelihood with said second cumulative metric indicative of highest likelihood to produce said indicator signal.

30. A method for encoding information bits comprising the steps of:

sorting information bits into a first group of bits and a second group of bits;

selecting a first number of adjacent bits within the first group of bits and the second group of bits including only bits of the first group;

calculating a first number of coded bits from the first number of adjacent bits;

selecting a second number of adjacent bits from the first group of bits and the second group of bits including only bits of the second group;

calculating a second number of coded bits from the second number of adjacent bits; and scrambling said second number of coded bits in dependence on the first number of coded bits to produce a third group of coded bits.

31. The method of claim 30 wherein the step of scrambling further comprises the steps of:

generating a scrambling mask dependent on the first group of bits; and adding the scrambling mask to the second group of coded bits.

32. A method for decoding a coded information signal containing a first set of coded symbols corresponding to a first set of information symbols and a second set of scrambled and coded symbols corresponding to a second set of information symbols, comprising the steps of:

processing a first portion of the coded information signal containing the first set of coded symbols to generate a number of hypotheses for the first set of information symbols and an associated likelihood metric;

processing a second portion of the coded information signal containing the second set of scrambled and coded symbols using the number of hypotheses for the first set of information symbols to unscramble and decode the scrambled and coded symbols and to compute an updated likelihood metric; and selecting one of the number of hypotheses with a highest likelihood metric and extracting the first and second sets of information symbols therefrom as desired decoded symbols when the one of the hypotheses has been extended to include all of the first and second set of information symbols.

* * * * *